(12) United States Patent
Park

(10) Patent No.: US 7,507,611 B2
(45) Date of Patent: Mar. 24, 2009

(54) THIN FILM TRANSISTOR AND METHOD FOR MANUFACTURING THE SAME

(75) Inventor: Hyuk Park, Jincheon-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 441 days.

(21) Appl. No.: 11/300,439

(22) Filed: Dec. 15, 2005

(65) Prior Publication Data

US 2006/0128077 A1  Jun. 15, 2006

(30) Foreign Application Priority Data

Dec. 15, 2004  (KR)  .................... 10-2004-0106056

(51) Int. Cl.
    *H01L 21/00* (2006.01)
(52) U.S. Cl. .................... 438/149; 438/591; 438/199; 438/216; 438/287; 438/592
(58) Field of Classification Search ................ 438/149
    See application file for complete search history.

(56) References Cited

U.S. PATENT DOCUMENTS

| 5,324,974 | A | * | 6/1994 | Liao | 257/344 |
| 5,414,287 | A | * | 5/1995 | Hong | 257/316 |
| 5,837,598 | A | * | 11/1998 | Aronowitz et al. | 438/532 |
| 5,847,428 | A | * | 12/1998 | Fulford et al. | 257/344 |
| 5,969,397 | A | * | 10/1999 | Grider et al. | 257/410 |
| 5,986,312 | A | * | 11/1999 | Kuroda | 257/382 |
| 6,051,865 | A | * | 4/2000 | Gardner et al. | 257/411 |
| 6,087,229 | A | * | 7/2000 | Aronowitz et al. | 438/287 |
| 6,093,661 | A | * | 7/2000 | Trivedi et al. | 438/769 |
| 6,188,115 | B1 | * | 2/2001 | Kamitani | 257/412 |
| 6,245,625 | B1 | * | 6/2001 | Gau | 438/305 |
| 6,316,321 | B1 | * | 11/2001 | Lin et al. | 438/305 |
| 6,331,468 | B1 | * | 12/2001 | Aronowitz et al. | 438/287 |
| 6,417,085 | B1 | * | 7/2002 | Batra et al. | 438/591 |
| 6,455,389 | B1 | * | 9/2002 | Huang et al. | 438/305 |
| 6,509,611 | B1 | * | 1/2003 | Park et al. | 257/330 |
| 6,512,273 | B1 | * | 1/2003 | Krivokapic et al. | 257/369 |
| 6,555,438 | B1 | * | 4/2003 | Wu | 438/305 |
| 6,607,990 | B2 | * | 8/2003 | Wakamiya | 438/769 |
| 6,610,571 | B1 | * | 8/2003 | Chen et al. | 438/265 |
| 6,649,543 | B1 | * | 11/2003 | Moore | 438/792 |
| 6,660,657 | B1 | * | 12/2003 | Sandhu et al. | 438/775 |
| 6,660,658 | B2 | * | 12/2003 | Sandhu et al. | 438/775 |
| 6,686,298 | B1 | * | 2/2004 | Beaman et al. | 438/775 |
| 6,690,046 | B2 | * | 2/2004 | Beaman et al. | 257/288 |
| 6,744,098 | B2 | * | 6/2004 | Moore | 257/324 |
| 6,803,624 | B2 | * | 10/2004 | Rudeck et al. | 257/315 |
| 6,806,517 | B2 | * | 10/2004 | Kim et al. | 257/204 |
| 6,815,375 | B2 | * | 11/2004 | Moore | 438/792 |
| 6,833,329 | B1 | * | 12/2004 | Moore | 438/770 |
| 6,846,716 | B2 | * | 1/2005 | Yeap et al. | 438/367 |

(Continued)

*Primary Examiner*—N Drew Richards
*Assistant Examiner*—Ankush k Singal
(74) *Attorney, Agent, or Firm*—McKenna Long & Aldridge LLP

(57) ABSTRACT

A method for manufacturing a thin film transistor includes forming a gate oxide film on a substrate, forming a first nitride layer on the gate oxide film, forming a polysilicon layer on the first nitride layer, forming a second nitride layer on sidewalls of the gate oxide film, first nitride layer, and polysilicon layer, and implanting impurity ions to form a pocket below the second nitride layer.

15 Claims, 4 Drawing Sheets

U.S. PATENT DOCUMENTS

| | | | |
|---|---|---|---|
| 6,995,066 B2* | 2/2006 | Shim | 438/303 |
| 7,161,203 B2* | 1/2007 | Basceri et al. | 257/296 |
| 7,192,881 B2* | 3/2007 | Kammler et al. | 438/740 |
| 7,217,624 B2* | 5/2007 | Lim et al. | 438/302 |
| 7,220,651 B2* | 5/2007 | Lee et al. | 438/303 |
| 7,344,948 B2* | 3/2008 | Sandhu et al. | 438/287 |
| 7,419,879 B2* | 9/2008 | Choi et al. | 438/283 |
| 2002/0052124 A1* | 5/2002 | Raaijmakers et al. | 438/778 |
| 2002/0109197 A1* | 8/2002 | Nakamura | 257/408 |
| 2002/0163039 A1* | 11/2002 | Clevenger et al. | 257/340 |
| 2003/0203556 A1* | 10/2003 | Segawa | 438/200 |
| 2004/0171261 A1* | 9/2004 | Song et al. | 438/691 |
| 2004/0245564 A1* | 12/2004 | Ogura et al. | 257/315 |
| 2004/0266154 A1* | 12/2004 | Lim et al. | 438/592 |
| 2005/0048732 A1* | 3/2005 | Park et al. | 438/305 |
| 2005/0059228 A1* | 3/2005 | Bu et al. | 438/595 |
| 2005/0064690 A1* | 3/2005 | Amos et al. | 438/592 |
| 2005/0136606 A1* | 6/2005 | Rulke et al. | 438/305 |
| 2005/0156229 A1* | 7/2005 | Yeap et al. | 257/327 |
| 2005/0164431 A1* | 7/2005 | Bu et al. | 438/149 |
| 2005/0189660 A1* | 9/2005 | Bu et al. | 257/900 |
| 2005/0250287 A1* | 11/2005 | Chen et al. | 438/300 |
| 2005/0275046 A1* | 12/2005 | Goldbach et al. | 257/412 |
| 2005/0280123 A1* | 12/2005 | Lee | 257/637 |

* cited by examiner

THIN FILM TRANSISTOR AND METHOD FOR MANUFACTURING THE SAME

CROSS-REFERENCE TO RELATED APPLICATION

This application claims the benefit of Korean Patent Application No. P2004-0106056, filed on Dec. 15, 2004, which is hereby incorporated by reference for all purposes as if fully set forth herein.

BACKGROUND OF THE INVENTION

1. Field of the Invention

The present invention relates to a thin film transistor and method for manufacturing the same, and more particularly, to a thin film transistor and method for manufacturing the same in which ion penetration from source and drain regions is suppressed, and stress generated from gate sidewalls and an interlayer dielectric film is suppressed.

2. Discussion of the Related Art

The reliability of a complementary metal oxide semiconductor (CMOS) device having high performance and high density is important. If the size of the device is reduced, the thickness of a gate oxide film is correspondingly thinned. However, a power source supplied through a power supplier is not decreased in proportion to the thickness reduction. Accordingly, electrical stress is generated that reduces the reliability of the gate oxide film.

FIG. 1 is a cross sectional view of a conventional thin film transistor.

Referring to FIG. 1, a gate oxide film 110 is formed on a semiconductor substrate 100. The top surface of the gate oxide film 110 is nitridized to form a first nitride layer 120. On the first nitride layer 120, a polysilicon layer 130 is formed. A pocket 140 is formed in a portion of the semiconductor substrate 100 below the edge of the gate oxide film 110 by implanting impurity ions, e.g., boron ions, using a tilt implantation method. Subsequently, a lightly doped drain (LDD) is formed in the semiconductor substrate 100 by implanting impurity ions onto the semiconductor substrate 100 using the polysilicon layer 130 as a mask. A spacer which comprises an oxide layer 160 and a second nitride layer 170 is formed on the sidewalls of the gate oxide film 110, first nitride layer, and polysilicon layer 130. Then, using the spacer 160 and 170 and the polysilicon layer 130 as a mask, impurity ions are implanted at a high density onto the semiconductor substrate 100 to form source/drain regions 180.

The first nitride layer 120 is formed to prevent ion penetration from the polysilicon layer 130 to the gate oxide film 110.

Although ion penetration from the polysilicon layer 130 to the gate oxide film 110 may be prevented, a other problems still remain, for example, ion penetration from the pocket 140, including the source/drain regions, to the gate oxide film 110, and electrical stress occurring to the gate oxide film 110.

SUMMARY OF THE INVENTION

Accordingly, the present invention is directed to a thin film transistor and method for manufacturing the same, which substantially obviates one or more problems that may be due to limitations and disadvantages of the related art.

The present invention can provide a thin film transistor and method for manufacturing the same in which ion penetration from extended source/drain regions to a gate oxide film and electrical stress occurring to a gate electrode are suppressed, thereby reducing gate leakage and providing a highly reliable transistor.

Additional advantages and features of the invention will be set forth in part in the description which follows and in part will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the invention, as embodied and broadly described herein, there is provided a method for manufacturing a thin film transistor that comprises the steps of forming a gate oxide film on a substrate; forming a first nitride layer on the gate oxide film; forming a polysilicon layer on the first nitride layer; forming a second nitride layer on sidewalls of the gate oxide film, first nitride layer, and polysilicon layer; and implanting impurity ions to form a pocket below the second nitride layer.

In another aspect of the present invention, there is provided a thin film transistor comprising a semiconductor substrate; a gate oxide film on the semiconductor substrate; a first nitride layer on the gate oxide film; a polysilicon layer on the first nitride layer; a second nitride layer on sidewalls of the gate oxide film, first nitride layer, and polysilicon layer; and a pocket formed by implanting impurity ions in a portion of the semiconductor substrate below the second nitride layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate embodiments of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
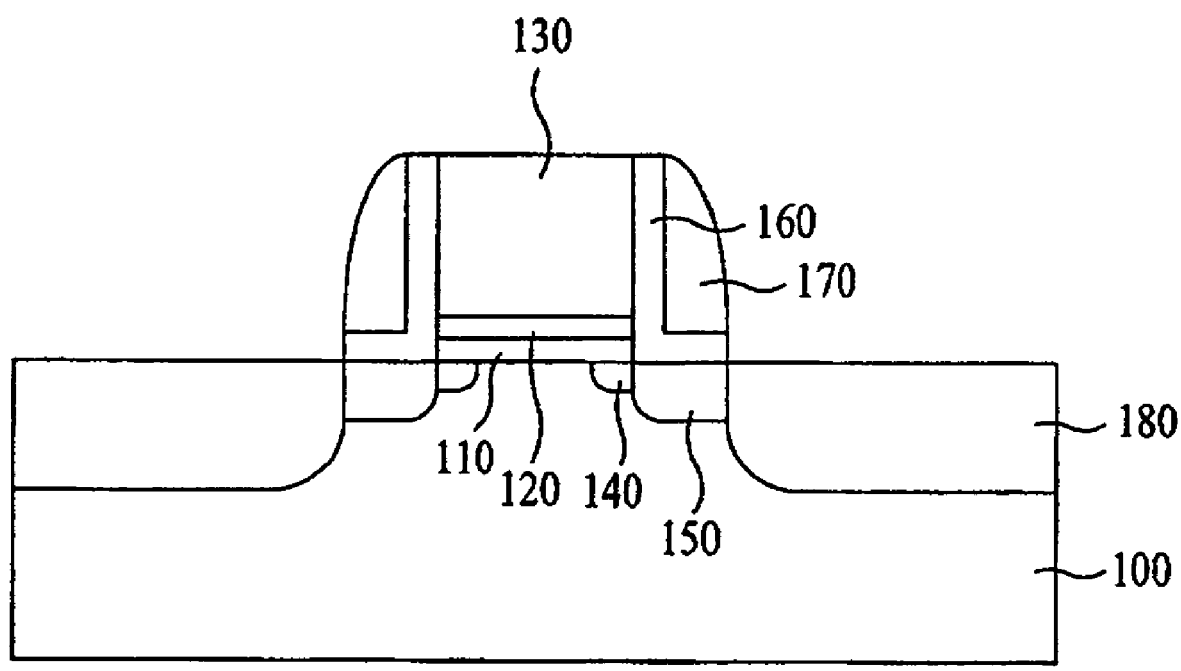
FIG. 1 is a cross sectional view of a conventional thin film transistor.
Figure 2A:
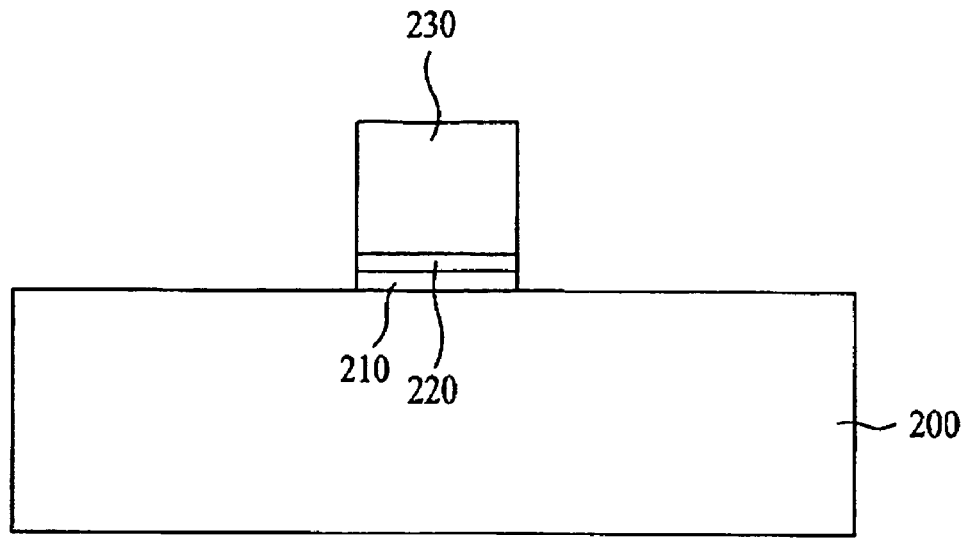
FIGS. 2A to 2E are cross sectional views illustrating a method for manufacturing a thin film transistor according to the present invention.

Referring to FIG. 2A, a gate oxide film 210 is formed on a semiconductor substrate 200, for example, by using a thermal oxidation process. The thermal oxidation process can be performed at a temperature of 650° C. to 750° C. by rapid thermal processing (RTP). The gate oxide film 210 has an exemplary thickness of 100 Å to 300 Å.

The gate oxide film 210 is then treated with plasma of a high concentration so that a first nitride layer 220 is formed on the top surface of the gate oxide film 210. The first nitride layer 220 has an exemplary thickness of 500 Å to 2000 Å.

Subsequently, a polysilicon layer 230 is formed on the first nitride layer 220 with a low pressure chemical vapor deposition (LPCVD) process.

Figure 2B:
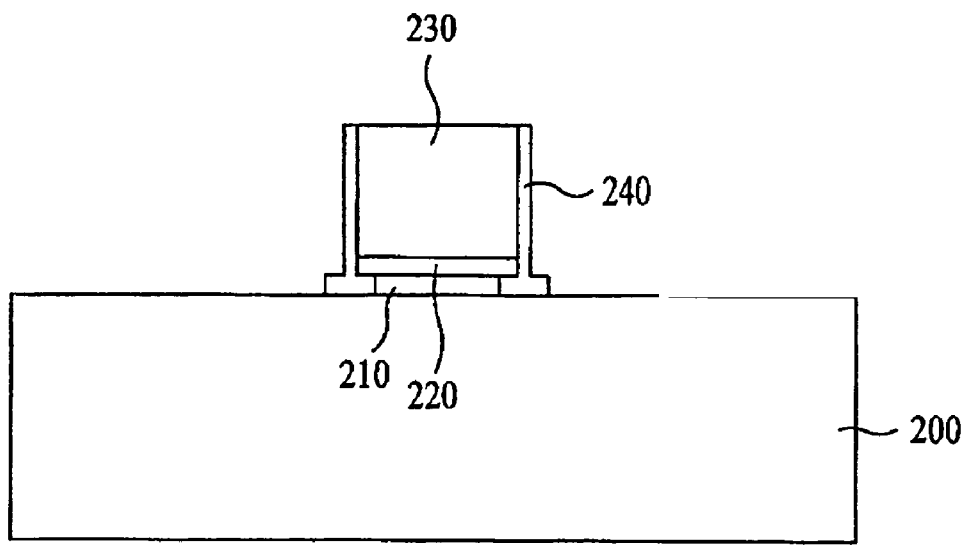

Then, as shown in FIG. 2B, a plasma treatment is performed to form a second nitride layer 240 on sidewalls of the gate oxide film 210, first nitride layer 220, and polysilicon layer 230. The edge portion of the gate oxide film 210 can be nitridized such that a portion of the second nitride layer 240 is below the first nitride layer 220.

The second nitride layer can prevent ion penetration into the gate oxide film 210 from a pocket to be formed later.

Figure 2C:
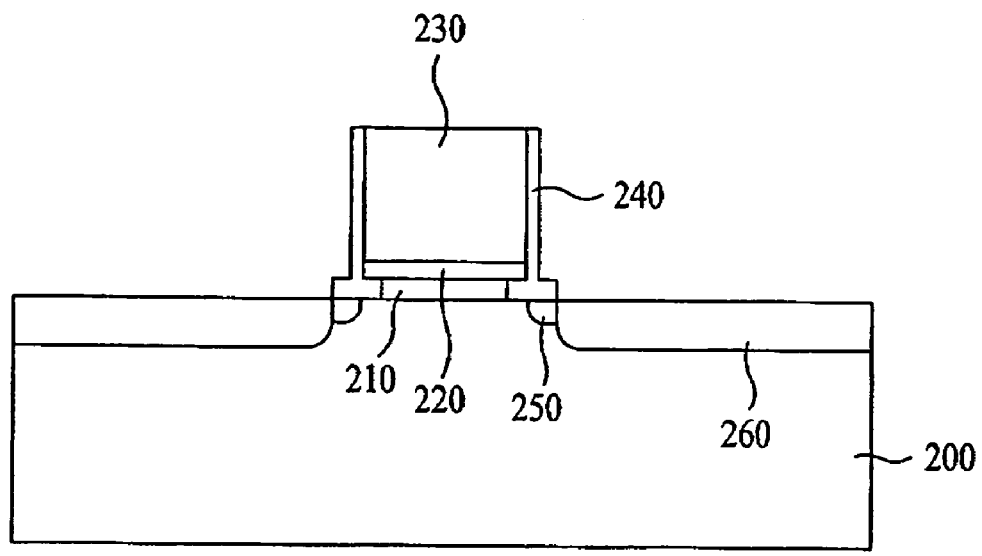

Referring to FIG. 2C, ion implantation for a pocket 250 and ion implantation for a lightly doped drain (LDD) 260 are sequentially performed on the semiconductor substrate 200. The implantation for the pocket 250 can optionally be performed with a tilt implantation method such that the pocket 250 is formed in a portion of the semiconductor substrate 200 immediately below the second nitride layer 240, thereby facilitating formation of an extended source/drain region.

Figure 2D:
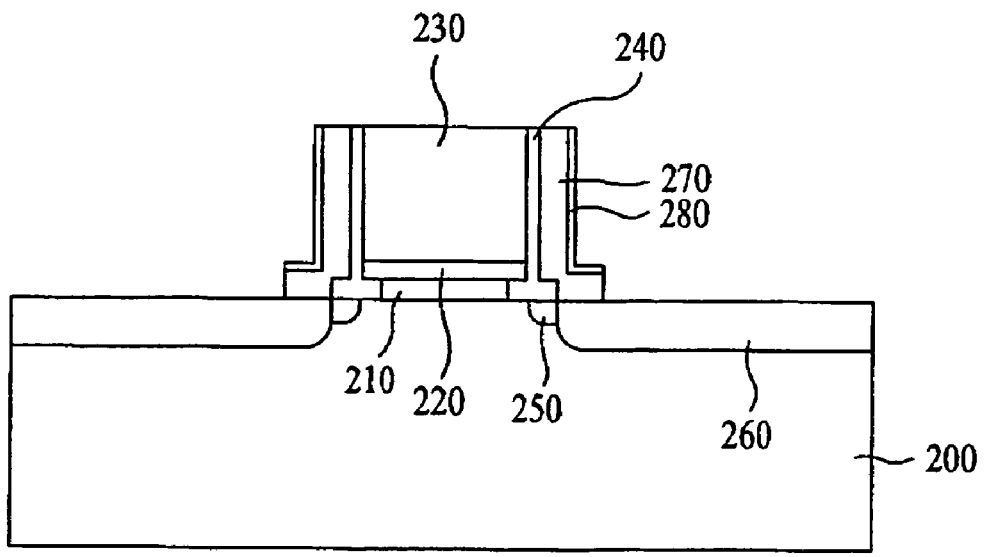

Referring to FIG. 2D, an oxide layer 270, for example, a tetra-ethoxysilane (TEOS) oxide layer, is then formed on the sidewall of the second nitride layer 240 by a LPCVD process. After the oxide layer 270 is deposited, a first buffer layer 280 is formed on the sidewall of the oxide layer 270. The first buffer layer 280 serves to suppress electrical stresses occurring on the gate oxide film 210. The first buffer layer 280 can be formed with an oxide compound.

Figure 2E:
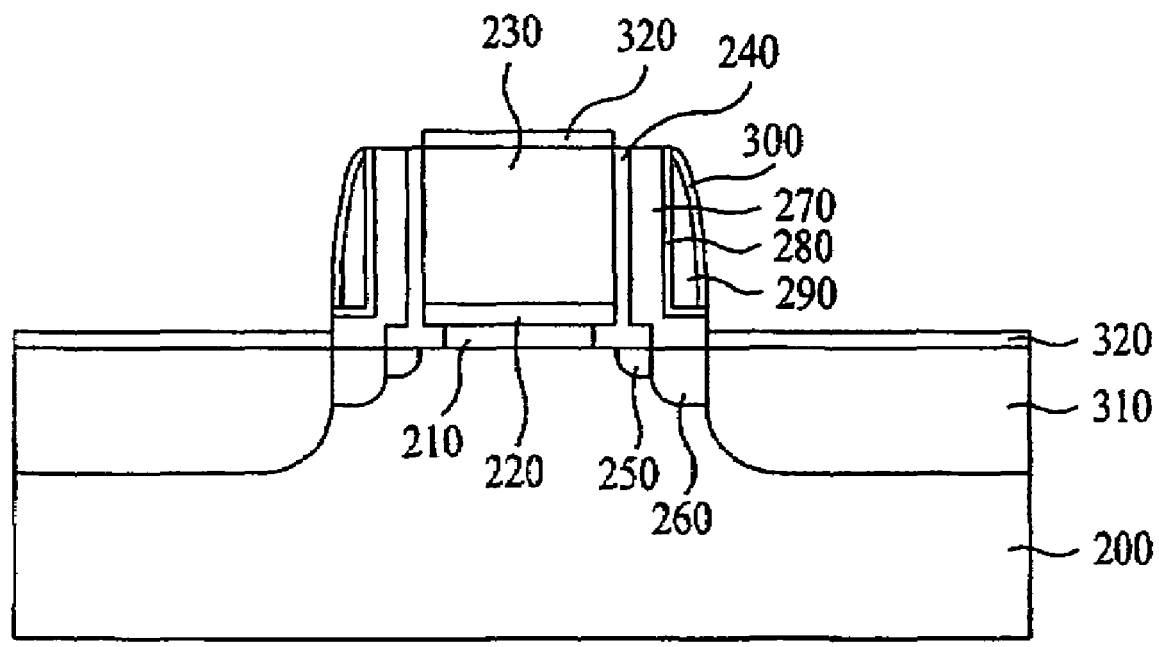

Referring to FIG. 2E, a third nitride layer 290 is formed on the sidewall of the first buffer layer 280. A second buffer layer 300 is then formed on the sidewall of the third nitride layer 290. The second buffer layer 300 can be formed more thickly than the first buffer layer 280. The second buffer layer 290 can alleviate stress applied to the polysilicon layer 230 and improve the reliability of the device.

The third nitride layer 290 and second buffer layer 300 constitute a spacer together with the oxide layer 270 and first buffer layer 280.

Subsequently, ion implantation for a source/drain region 310 is performed on the semiconductor substrate 200 using the polysilicon layer 230 and the spacer as a mask.

By performing plasma treatment on a gate electrode, and thus forming nitride layer on the sidewall thereof, ion penetration, for example, boron penetration, from extended source/drain regions to a gate oxide film may be highly suppressed. Furthermore, since a spacer formed on a sidewall of the gate electrode comprises one or more buffer layers, electrical stresses occurring to the gate electrode can be remarkably mitigated. Thus, gate leakage is reduced and high reliability of a device is improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a thin film transistor comprising the steps of:
    forming a gate oxide film on a substrate;
    forming a first nitride layer on the gate oxide film;
    forming a polysilicon layer on the first nitride layer;
    forming a second nitride layer on sidewalls of the gate oxide film, the first nitride layer, and the polysilicon layer;
    forming an oxide layer on the sidewall of the second nitride layer;
    forming a first buffer layer on a sidewall of the oxide layer;
    forming a third nitride layer on a sidewall of the first buffer layer;
    forming a second buffer layer on a sidewall of the third nitride layer;
    implanting impurity ions to form a pocket below the second nitride layer; and
    nitridizing an edge portion of the gate oxide film to form a bottom portion of the second nitride layer that is below the first nitride layer.

2. The method as claimed in claim 1, further comprising a step of implanting impurity ions to form a lightly doped drain.

3. The method as claimed in claim 1, wherein the first buffer layer is formed with an oxide compound.

4. The method as claimed in claim 1, wherein the second buffer layer is thicker than the first buffer layer.

5. The method as claimed in claim 1, further comprising a step of implanting a high density of impurity ions to form a source/drain using the polysilicon layer and the spacer as a mask.

6. The method as claimed in claim 1, wherein the first nitride layer is formed with plasma treatment.

7. The method as claimed in claim 1, wherein the second nitride layer is formed with plasma treatment.

8. The method as claimed in claim 1, wherein the gate oxide film is formed using a thermal oxidation process.

9. The method as claimed in claim 1, wherein the first nitride layer has a thickness of 500 Å to 2000 Å.

10. The method as claimed in claim 1, wherein the gate oxide film is has a thickness of 100 Å to 300 Å.

11. The method as claimed in claim 8, wherein the thermal oxidation process is performed at a temperature of 650° C. to 750° C. by rapid thermal processing.

12. The method as claimed in claim 5, further comprising a step of forming a salicide layer on the polysilicon layer and on the source/drain.

13. A thin film transistor comprising: a semiconductor substrate; a gate oxide film on the semiconductor substrate;
    a first nitrate layer on the oxide film;
    a polysilicon layer on the first nitride layer, wherein the gate oxide film, the first nitride layer, and the polysilicon layer each have sidewalls; and
    a second nitride layer on the sidewalls of the gate oxide film, the first nitride layer, and the polysilicon layer; and
    a pocket formed by implanting impurity ions in a portion of the semiconductor substrate below the second nitride layer,
    wherein an edge portion of the gate oxide film is nitridized to be a bottom portion of the second nitride layer that is below the first nitride layer.

14. The thin film transistor as claimed in claim 13, further comprising a spacer on a sidewall of the second nitride layer.

15. The thin film transistor as claimed in claim 14, wherein the spacer comprises an oxide layer on the sidewall of the second nitride layer, a first buffer layer on a sidewall of the oxide layer, a third nitride layer on a sidewall of the first buffer layer, and a second buffer layer on a sidewall of the third nitride layer.

* * * * *